(12) United States Patent
You

(10) Patent No.: US 9,672,890 B2
(45) Date of Patent: Jun. 6, 2017

(54) SEMICONDUCTOR MEMORY APPARATUS

(71) Applicant: SK hynix Inc., Icheon-si, Gyeonggi-do (KR)

(72) Inventor: Jung Taek You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/802,178

(22) Filed: Jul. 17, 2015

(65) Prior Publication Data
US 2016/0329088 A1    Nov. 10, 2016

(30) Foreign Application Priority Data
May 8, 2015   (KR) .................. 10-2015-0064847

(51) Int. Cl.
| G11C 7/00 | (2006.01) |
| G11C 11/406 | (2006.01) |
| G11C 11/408 | (2006.01) |
| G11C 7/08 | (2006.01) |
| G11C 11/4091 | (2006.01) |
| G11C 29/50 | (2006.01) |

(52) U.S. Cl.
CPC ........ *G11C 11/406* (2013.01); *G11C 11/4085* (2013.01); *G11C 11/4087* (2013.01); *G11C 7/08* (2013.01); *G11C 11/4091* (2013.01); *G11C 29/50016* (2013.01)

(58) Field of Classification Search
CPC .......... G11C 2029/0411; G11C 11/419; G11C 2207/104; G11C 29/765; G11C 29/789; G11C 29/82; G11C 5/025; G11C 7/1006; G11C 7/18; G11C 8/16
USPC ............ 365/185.04, 185.09, 185.11, 185.22, 365/185.33, 201
See application file for complete search history.

(56) References Cited

U.S. PATENT DOCUMENTS

2005/0047239 A1* 3/2005 Takahashi ......... G11C 11/40603 365/222
2011/0119558 A1* 5/2011 Koshiyama ......... G06F 11/1048 714/758

FOREIGN PATENT DOCUMENTS

KR    1020130111074 A    10/2013

* cited by examiner

*Primary Examiner* — Thong Q Le
(74) *Attorney, Agent, or Firm* — William Park & Associates Ltd.

(57) ABSTRACT

A semiconductor memory apparatus includes a plurality of cell arrays; and a use information storage block configured to determine whether a data write operation has already been performed for the plurality of cell arrays, and generate a plurality of control signals, wherein the semiconductor memory apparatus is configured to control a refresh operation for the plurality of cell arrays according to the plurality of control signals.

20 Claims, 5 Drawing Sheets

US 9,672,890 B2

SEMICONDUCTOR MEMORY APPARATUS

CROSS-REFERENCES TO RELATED APPLICATION

The present application claims priority under 35 U.S.C. §119(a) to Korean application number 10-2015-0064847 filed on May 8, 2015, in the Korean Intellectual Property Office, which is incorporated herein by reference in its entirety.

BACKGROUND

1. Technical Field

Various embodiments generally relate to a semiconductor circuit, and more particularly to a semiconductor memory apparatus.

2. Related Art

Recent developments in highly integrated semiconductor apparatus are leading to advances in three-dimensional integrated circuit packages, which are manufactured by stacking a plurality of semiconductor chips. As a result, operation current management became one of the most important issues in such highly integrated semiconductor apparatus, and various attempts are being made to reduce operation current.

SUMMARY

Various embodiments are directed to a semiconductor memory apparatus capable of reducing operation current.

In an embodiment, a semiconductor memory apparatus may include: a plurality of cell arrays; and a use information storage block configured to determine whether a data write operation has already been performed for the plurality of cell arrays, and generate a plurality of control signals, wherein the semiconductor memory apparatus is configured to control a refresh operation for the plurality of cell arrays according to the plurality of control signals.

In an embodiment, a semiconductor memory apparatus may include: a plurality of cell arrays; and a use information storage block configured to determine whether a data write operation has already been performed for the plurality of cell arrays, and generate a plurality of control signals, wherein the semiconductor memory apparatus is configured to control a read operation for the plurality of cell arrays according to the plurality of control signals.

In an embodiment, a semiconductor memory apparatus may include: a plurality of cell arrays; and a use information storage block configured to determine whether a data write operation has already been performed for the plurality of cell arrays, and generate a plurality of control signals, wherein the semiconductor memory apparatus is configured to control a refresh operation and a read operation for the plurality of cell arrays according to the plurality of control signals.

In an embodiment, the semiconductor memory apparatus may be configured to perform the refresh operation according to a refresh command and the read operation according to a read command, regardless of a result of determining whether the data write operation has already been performed for the plurality of cell arrays, in response to a test mode signal.

In an embodiment, the semiconductor memory apparatus may be configured to block the refresh operation and the read operation for a cell array for which the data write operation is not performed, among the plurality of cell arrays, according to the plurality of control signals.

DETAILED DESCRIPTION

Hereinafter, a semiconductor memory apparatus will be described below with reference to the accompanying drawings through various examples of embodiments.

Figure 1:
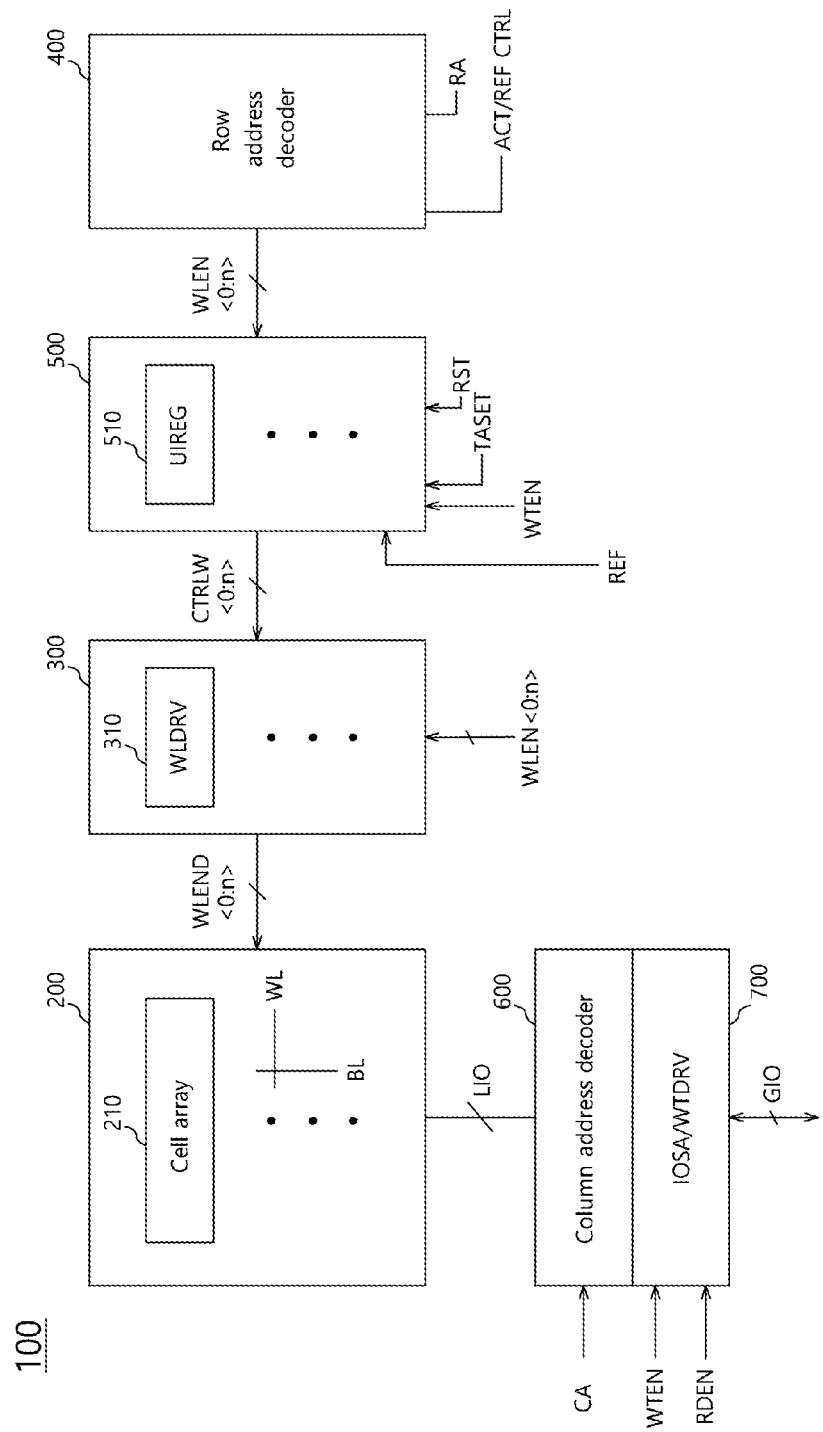
FIG. 1 is a diagram illustrating an example configuration of a semiconductor memory apparatus 100 in accordance with an embodiment.

As shown in FIG. 1, a semiconductor memory apparatus 100 in accordance with an embodiment may include a memory block 200, a word line driver block 300, a row address decoder 400, a use information storage block 500, a column address decoder 600, and a sense amplifier/write driver block 700.

The memory block 200 may include a plurality of cell arrays 210.

Each of the plurality of cell arrays 210 may include a plurality of memory cells (not shown).

The memory block 200 may include a plurality of memory cells, and a plurality of word lines and bit lines WL BL which are electrically coupled to the plurality of memory cells.

The plurality of bit lines BL may be electrically coupled to a plurality of local input/output lines LIO.

The plurality of word lines WL may be grouped into word line arrays (not shown) according to cell arrays 210. For example, each cell array 210 may include a word line array within its cell array area.

The word line arrays of the memory block 200 may be selectively activated according to a plurality of word line driving signals WLEND<0:n>.

The word line driver block 300 may include a plurality of word line drivers 310.

The plurality of word line drivers 310 may generate the plurality of word line driving signals WLEND<0:n> for driving the word line arrays in response to a plurality of control signals CTRLW<0:n>.

The row address decoder 400 may generate a plurality of word line enable signals WLEN<0:n> in response to a row address signal RA and an active/refresh control signal ACT/REF CTRL.

In a write operation, the sense amplifier/write driver block 700 may drive the data transmitted through a plurality of global input/output lines GIO and transmit resultant data to the plurality of local input/output lines LIO in response to a write enable signal WTEN.

In a read operation, the sense amplifier/write driver block 700 may sense and amplify the data transmitted through the plurality of local input/output lines LIO and transmit resultant data to the plurality of global input/output lines GIO in response to a read enable signal RDEN.

The column address decoder 600 may electrically couple, among the plurality of local input/output lines LIO, a local input/output line LIO corresponding to a column address signal CA to the sense amplifier/write driver block 700.

The write enable signal WTEN may be generated according to a write command.

In the write operation of the semiconductor memory apparatus 100, the word line enable signal WLEN<0> may be activated in an activation period of the write enable signal WTEN.

In a refresh operation of the semiconductor memory apparatus 100, while the word line enable signal WLEN<0> is not activated, the word line enable signal WLEN<0> may be activated to perform the refresh operation.

In the case where the word line enable signal WLEN<0> is activated in the activation period of the write enable signal WTEN, a corresponding word line array may be activated, and a data write operation may be performed for a corresponding cell array 210 according to the activation of the word line array.

In an embodiment, whether or not a word line array is activated according to the write operation, that is, whether or not the word line enable signal WLEN<0> is activated in the activation period of the write enable signal WTEN is stored, and the stored information may be used as a reference for determining whether the data write operation has already been performed for the corresponding cell array 210.

The use information storage block 500 may determine whether the data write operation has already been performed for the plurality of cell arrays 210, and, according to a determination result, may generate the control signals CTRLW<0:n> for blocking the refresh operation for cell arrays 210 for which the data write operation has not been performed.

Whether or not to perform the refresh operation may be determined using a refresh signal REF which is generated according to a refresh command.

The use information storage block 500 may generate the control signals CTRLW<0:n> according to the write enable signal WTEN, the plurality of word line enable signals WLEN<0:n> and the refresh signal REF.

According to the write enable signal WTEN and the plurality of word line enable signals WLEN<0:n>, the use information storage block 500 may determine whether the data write operation for a corresponding cell array 210 has already been performed or not.

According to a reset signal RST, the use information storage block 500 may initialize a resultant value of determining whether the data write operation has already been performed for corresponding memory cells.

When a test mode signal TASET is activated, the use information storage block 500 may activate the plurality of word line driving signals WLEND<0:n> regardless of a resultant value of determining whether the data write operation has already been performed for corresponding memory cells.

The use information storage block 500 may include a plurality of use information registers 510.

The use information registers 510 may be inputted in common with the write enable signal WTEN.

The use information registers 510 may be respectively inputted with the signal bits of the plurality of word line enable signals WLEN<0:n>.

The use information registers 510 may be inputted in common with the reset signal RST, the test mode signal TASET and the refresh signal REF.

Figure 2:
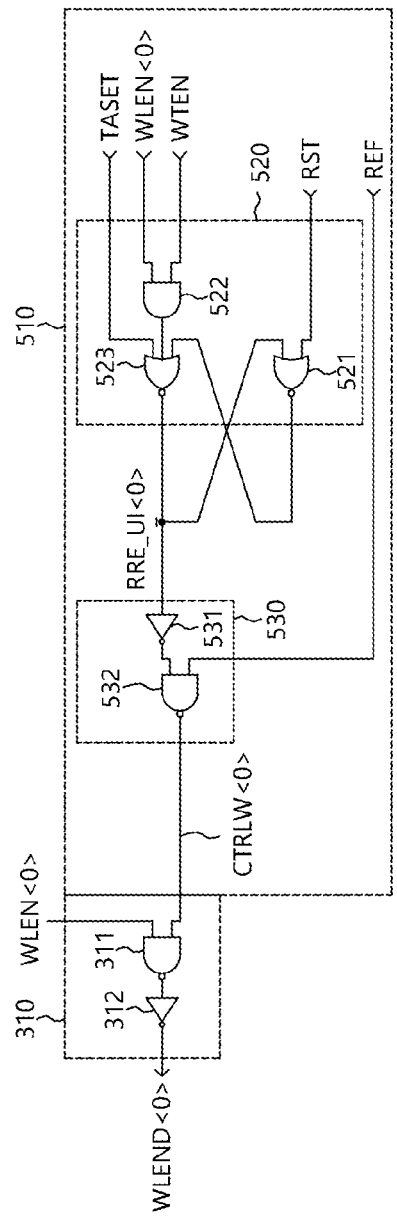
FIG. 2 is a diagram illustrating an example internal configuration of the word line driver (WLDRV) 310 and the use information register (UIREG) 510 shown in FIG. 1.

FIG. 2 is a diagram illustrating an example internal configuration of the use information register 510 which is inputted with the word line enable signal WLEN<0>, among the plurality of use information registers 510.

As shown in FIG. 2, the use information register 510 may generate a preliminary use information signal PRE_UI representing whether the data write operation has already been performed for a corresponding cell array 210.

The use information register 510 may generate the preliminary use information signal PRE_UI according to the write enable signal WTEN and the word line enable signal WLEN<0>.

The use information register 510 may generate the control signal CTRLW<0> according to the preliminary use information signal PRE_UI and the refresh signal REF.

The use information register 510 may include a use determination unit 520 and a control signal generation unit 530.

The use determination unit 520 may reset the preliminary use information signal PRE_UI to an initial value (e.g., a high level) according to the reset signal RST.

The use determination unit 520 may generate the preliminary use information signal PRE_UI in response to the write enable signal WTEN and the word line enable signal WLEN<0>.

The use determination unit 520 transitions the preliminary use information signal PRE_UI to a low level when the write enable signal WTEN and the word line enable signal WLEN<0> are activated to high levels.

The preliminary use information signal PRE_UI having the high level may mean that the data write operation for a corresponding cell array 210 has not yet been performed. That is to say, it may mean that data is not written in the corresponding cell array 210.

The preliminary use information signal PRE_UI having the low level may mean that the data write operation for the corresponding cell array 210 has already been performed at least one time. That is to say, it may mean that data is written in the corresponding cell array 210.

The use determination unit 520 may transition, according to the test mode signal TASET, the preliminary use information signal PRE_UI to the low level regardless of the write enable signal WTEN and the word line enable signal WLEN<0>.

The use determination unit 520 may include logic gates 521 to 523.

The control signal generation unit 530 may generate the control signal CTRLW<0> according to the preliminary use information signal PRE_UI and the refresh signal REF.

The control signal generation unit 530 may output the control signal CTRLW<0> at a high level if the refresh signal REF is activated to a high level in the state in which the preliminary use information signal PRE_UI has the low level.

The control signal generation unit 530 may include logic gates 531 and 532.

The word line driver 310 may include logic gates 311 and 312.

In the case where the control signal CTRLW<0> has the high level, the word line driver 310 may activate the word line driving signal WLEND<0> to a high level according to the word line enable signal WLEN<0>.

Since the word line driving signal WLEND<0> has the high level, a corresponding word line array of the memory block 200 is driven. As the word line array is driven, the refresh operation for the cell array 210 of the memory block 200 may be performed.

By contrast, in the case where the control signal CTRLW<0> has a low level, the word line driver 310 may retain the word line driving signal WLEND<0> at a low level regardless of the word line enable signal WLEN<0>.

Since the word line driving signal WLEND<0> has the low level, the corresponding word line array of the memory block 200 is not driven. As the word line array is not driven, the refresh operation for the cell array 210 of the memory block 200 may be blocked.

As described above, even if the refresh signal REF is activated, the refresh operation is not performed for a cell array 210 that has not been written with data, and thus current consumption may be reduced.

Figure 3:
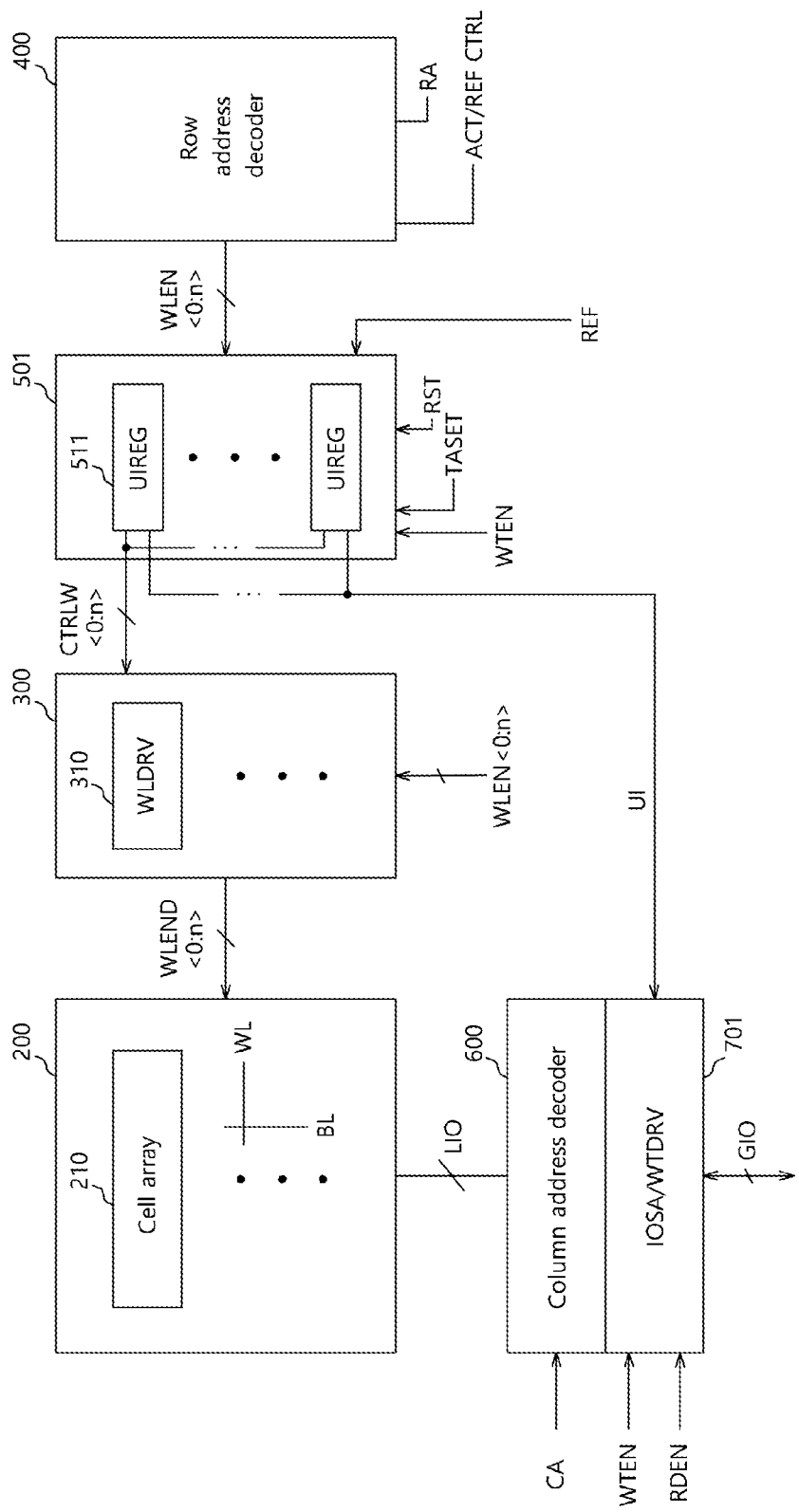
FIG. 3 is a diagram illustrating an example configuration of a semiconductor memory apparatus 101 in accordance with an embodiment.

As shown in FIG. 3, a semiconductor memory apparatus 101 in accordance with an embodiment may include a memory block 200, a word line driver block 300, a row address decoder 400, a use information storage block 501, a column address decoder 600, and a sense amplifier/write driver block 701.

The memory block 200 may include a plurality of cell arrays 210.

Each of the plurality of cell arrays 210 may include a plurality of memory cells (not shown).

The memory block 200 may include a plurality of memory cells, and a plurality of word lines and bit lines WL and BL which are electrically coupled to the plurality of memory cells.

The plurality of bit lines BL may be electrically coupled with a plurality of local input/output lines LIO.

The plurality of word lines WL may be grouped into word line arrays (not shown) according to cell arrays 210. For example, each cell array 210 may include a word line array within its cell array area.

The word line arrays of the memory block 200 may be selectively activated according to a plurality of word line driving signals WLEND<0:n>.

The word line driver block 300 may include a plurality of word line drivers 310.

The plurality of word line drivers 310 may generate the plurality of word line driving signals WLEND<0:n> for driving the word line arrays in response to a plurality of control signals CTRLW<0:n>.

The row address decoder 400 may generate a plurality of word line enable signals WLEN<0:n> in response to a row address signal RA and an active/refresh control signal ACT/REF CTRL.

In a write operation, the sense amplifier/write driver block 701 may drive the data transmitted through a plurality of global input/output lines GIO and transmit resultant data to the plurality of local input/output lines LIO in response to a write enable signal WTEN.

In a read operation, the sense amplifier/write driver block 701 may sense and amplify the data transmitted through the plurality of local input/output lines LIO and transmit resultant data to the plurality of global input/output lines GIO in response to a read enable signal RDEN.

The read enable signal RDEN may be generated according to a read command.

The sense amplifier/write driver block 701 may block, according to a use information signal UI, a data sensing/amplification operation regardless of activation of the read enable signal RDEN.

The column address decoder 600 may electrically couple, among the plurality of local input/output lines LIO, a local input/output line LIO corresponding to a column address signal CA to the sense amplifier/write driver block 701.

In the write operation of the semiconductor memory apparatus 100, the word line enable signal WLEN<0> may be activated in an activation period of the write enable signal WTEN.

In a refresh operation of the semiconductor memory apparatus 100, while the word line enable signal WLEN<0> is not activated, the word line enable signal WLEN<0> may be activated to perform the refresh operation.

In the case where the word line enable signal WLEN<0> is activated in the activation period of the write enable signal WTEN, a corresponding word line array may be activated, and a data write operation may be performed for a corresponding cell array 210, according to the activation of the word line array.

In an embodiment, whether or not the word line enable signal WLEN<0> is activated in the activation period of the write enable signal WTEN is stored, and the stored information may be used as a reference for determining whether the data write operation has already been performed for corresponding memory cells.

The use information storage block 501 may determine whether the data write operation has already been performed for a corresponding cell array 210, and, according to a determination result, may block the refresh operation and the read operation for a cell array 210 for which the data write operation has not been performed.

The blocking of the read operation may be implemented by blocking the sensing/amplification operation in the read operation.

The refresh operation may be determined using a refresh signal REF which is generated according to a refresh command.

The read operation may be determined using the read enable signal RDEN which is generated according to a read command.

The use information storage block 501 may generate the control signals CTRLW<0:n> and the use information signal UI according to the write enable signal WTEN, the plurality of word line enable signals WLEN<0:n> and the refresh signal REF.

According to the write enable signal WTEN and the plurality of word line enable signals WLEN<0:n>, the use information storage block 501 may determine whether the data write operation for corresponding memory cells has already been performed or not.

According to a reset signal RST, the use information storage block 501 may initialize a resultant value of determining whether the data write operation has already been performed for corresponding memory cells.

When a test mode signal TASET is activated, the use information storage block 501 may activate the plurality of control signals CTRLW<0:n> regardless of a resultant value of determining whether the data write operation has already been performed for corresponding memory cells.

The use information storage block 501 may include a plurality of use information registers 511.

The use information registers 511 may be inputted in common with the write enable signal WTEN.

The use information registers 511 may be respectively inputted with the plurality of word line enable signals WLEN<0:n>.

The use information registers 511 may be inputted in common with the reset signal RST, the test mode signal TASET and the refresh signal REF.

Signal lines for outputting the use information signal UI may be shared by use information registers 511.

Figure 4:
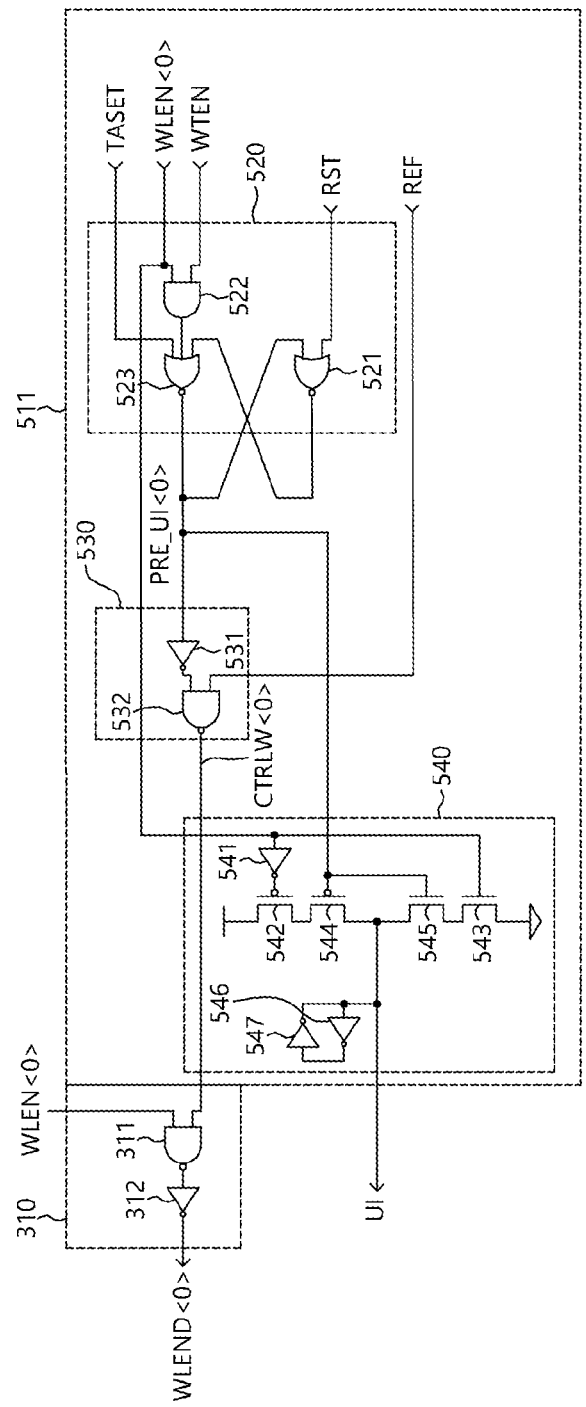
FIG. 4 is a diagram illustrating an example internal configuration of the word line driver (WLDRV) 310 and the use information register (UIREG) 511 shown in FIG. 3.

FIG. 4 is a diagram illustrating an example internal configuration of the use information register 511 which is inputted with the write enable signal WTEN and the word line enable signal WLEN<0>, among the plurality of use information registers 511.

As shown in FIG. 4, the use information register 511 may generate a preliminary use information signal PRE_UI representing whether the data write operation has already been performed for corresponding memory cells.

The use information register 511 may output the preliminary use information signal PRE_UI as the use information signal UI according to the word line enable signal WLEN<0>.

The use information storage block 501 may generate the control signals CTRLW<0:n> and the use information signal UI according to the write enable signal WTEN, the plurality of word line enable signals WLEN<0:n> and the refresh signal REF.

The use information register 511 may block the refresh operation by generating the preliminary use information signal PRE_UI according to the write enable signal WTEN and the word line enable signal WLEN<0> and blocking the activation of the word line driving signal WLEND<0> through using the control signal CTRLW<0> generated according to the preliminary use information signal PRE_UI and the refresh signal REF.

The use information register 511 may block the sensing/amplification operation of the sense amplifier/write driver block 701 in the read operation by using the use information signal UI.

The use information register 511 may include a use determination unit 520, a control signal generation unit 530, and a use information generation unit 540.

The use determination unit 520 may reset the preliminary use information signal PRE_UI to an initial value (e.g., a high level) according to the reset signal RST.

The use determination unit 520 may generate the preliminary use information signal PRE_UI in response to the write enable signal WTEN and the word line enable signal WLEN<0>.

The use determination unit 520 transitions the preliminary use information signal PRE_UI to a low level when the write enable signal WTEN and the word line enable signal WLEN<0> are activated to high levels.

The preliminary use information signal PRE_UI having the high level may mean that the data write operation for a corresponding cell array 210 has not yet been performed. That is to say, it may mean that data is not written in the corresponding cell array 210.

The preliminary use information signal PRE_UI having the low level may mean that the data write operation for the corresponding cell array 210 has already been performed at least one time. That is to say, it may mean that data is written in the corresponding cell array 210.

The use determination unit 520 may transition, according to the test mode signal TASET, the preliminary use information signal PRE_UI to the low level regardless of the write enable signal WTEN and the word line enable signal WLEN<0>.

The use determination unit 520 may include logic gates 521 to 523.

The control signal generation unit 530 may generate the control signal CTRLW<0> according to the preliminary use information signal PRE_UI and the refresh signal REF.

The control signal generation unit 530 may output the control signal CTRLW<0> at a high level if the refresh signal REF is activated to a high level in the state in which the preliminary use information signal PRE_UI has the low level.

The control signal generation unit 530 may include logic gates 531 and 532.

The word line driver 310 may include logic gates 311 and 312.

In the case where the control signal CTRLW<0> has the high level, the word line driver 310 may activate the word line driving signal WLEND<0> to a high level according to the word line enable signal WLEN<0>.

Since the word line driving signal WLEND<0> has the high level, a corresponding word line array of the memory block 200 is driven. As the word line array is driven, the refresh operation for the cell array 210 of the memory block 200 may be performed.

By contrast, in the case where the control signal CTRLW<0> has a low level, the word line driver 310 may retain the word line driving signal WLEND<0> at a low level regardless of the word line enable signal WLEN<0>.

Since the word line driving signal WLEND<0> has the low level, the corresponding word line array of the memory block 200 is not driven. As the word line array is not driven, the refresh operation for the cell array 210 of the memory block 200 may be blocked.

The use information generation unit 540 may generate the use information signal UI according to the word line enable signal WLEN<0> and the preliminary use information signal PRE_UI.

When the word line enable signal WLEN<0> is activated, the use information generation unit 540 may output the use information signal UI which is generated by inverting the preliminary use information signal PRE_UI.

The use information generation unit 540 may include a plurality of logic gates 541 to 547.

The logic gate 541 inverts the word line enable signal WLEN<0> and outputs the inverted signal of the word line enable signal WLEN<0>.

When the word line enable signal WLEN<0> is activated, the logic gates 542 to 545 invert the preliminary use information signal PRE_UI and output the use information signal UI.

The logic gates 546 and 547 latch the use information signal UI.

Figure 5:
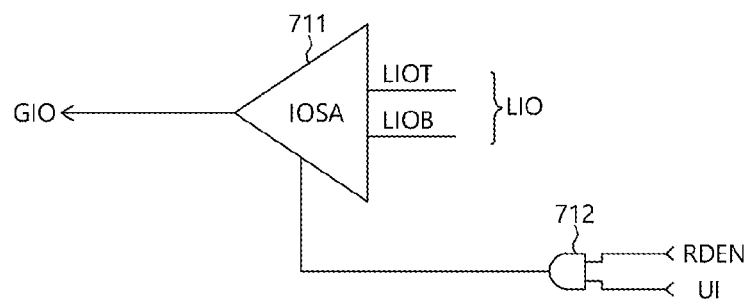
FIG. 5 is a diagram illustrating an example internal configuration of the sense amplifier/write driver block 701 shown in FIG. 3.

As shown in FIG. 5, the sense amplifier/write driver block 701 may include a sense amplifier 711 and a logic gate 712.

The logic gate 712 may perform an AND operation on the read enable signal RDEN and the use information signal UI, and output a resultant signal.

The sense amplifier 711 may be coupled to the local input/output line LIO and the global input/output line GIO. The sense amplifier 711 may sense and amplify the data transmitted through the local input/output line LIO when the output signal of the logic gate 712 has a high level, that is, both the read enable signal RDEN and the use information signal UI have high levels, and transmit resultant data to the global input/output line GIO.

In the case where the use information signal UI has the high level (e.g., when data is written in the corresponding cell array 210), the sense amplifier 711 may perform the sensing/amplification operation.

By contrast, in the case where the output of the logic gate 712 has a low level (e.g., the use information signal UI has a low level, the sense amplifier 711 does not perform the sensing/amplification operation regardless of the read enable signal RDEN.

In the case where the use information signal UI has the low level (e.g., when data is not written in the corresponding cell array 210), the sense amplifier 711 does not perform the sensing/amplification operation.

As described above, even if the refresh signal REF or the read enable signal RDEN is activated, the refresh operation and the data sensing/amplification operation are not performed for a cell array 210 that has not been written with data, and thus current consumption may be reduced.

While various embodiments have been described above, it will be understood to those skilled in the art that the embodiments described are examples only. Accordingly, the semiconductor memory apparatus described herein should not be limited based on the described embodiments.

What is claimed is:

1. A semiconductor memory apparatus comprising:
    a plurality of cell arrays; and
    a use information storage block configured to determine whether a data has not been written to the plurality of cell arrays, and generate a plurality of control signals,
    wherein the use information storage block is configured to block a refresh operation for a cell array in which the data has not been written, among the plurality of cell arrays, according to the plurality of control signals regardless of an activation of a refresh command, and
    wherein the use information storage block is configured to allow the refresh operation for the cell array in which the data has been written.

2. The semiconductor memory apparatus according to claim 1, further comprising:
    a plurality of word line drivers configured to generate a plurality of word line driving signals in response to the plurality of control signals, wherein the plurality of word line driving signals are used for driving word line arrays electrically coupled to the plurality of cell arrays.

3. The semiconductor memory apparatus according to claim 2, wherein the plurality of word line drivers are configured to generate the plurality of word line driving signals in response to the plurality of control signals and a plurality of word line enable signals.

4. The semiconductor memory apparatus according to claim 1, wherein the use information storage block is configured to generate the plurality of control signals according to a write enable signal, a plurality of word line enable signals and a refresh signal.

5. The semiconductor memory apparatus according to claim 1, wherein the use information storage block comprises:
    a use determination unit configured to generate a plurality of preliminary use information signals in response to a write enable signal and a plurality of word line enable signals; and
    a control signal generation unit configured to generate the plurality of control signals according to the plurality of preliminary use information signals and a refresh signal.

6. The semiconductor memory apparatus according to claim 1, wherein the information storage block is configured to perform the refresh operation according to the refresh command, regardless of a result of determining whether the data write operation has already been performed for the plurality of cell arrays, in response to a test mode signal.

7. The semiconductor memory apparatus according to claim 1, further comprising:
    a plurality of word line arrays electrically coupled to the plurality of cell arrays;
    a row address decoder configured to generate a plurality of word line enable signals in response to a row address signal and an active/refresh control signal; and
    a plurality of word line drivers configured to generate a plurality of word line driving signals for driving the plurality of word line arrays in response to the plurality of control signals.

8. A semiconductor memory apparatus comprising:
    a plurality of cell arrays; and
    a use information storage block configured to determine whether a data has not been written to the plurality of cell arrays, and generate a preliminary user information signal,
    wherein the use information storage block is configured to block a read operation for a cell array in which the data has not been written, among the plurality of cell arrays, according to the preliminary user information signal regardless of an activation of a read command, and
    wherein the use information storage block is configured to allow the read operation for the cell array in which the data has been written.

9. The semiconductor memory apparatus according to claim 8, further comprising:
    a plurality of sense amplifiers configured to perform a sensing operation, wherein the sense amplifiers do not perform the sensing operation for data outputted from the cell arrays, according to use information signals with respect to the cell arrays, regardless of a read enable signal.

10. The semiconductor memory apparatus according to claim 8, wherein the use information storage block is configured to generate a use information signals according to a write enable signal and a plurality of word line enable signals.

11. The semiconductor memory apparatus according to claim 8, wherein the use information storage block comprises:
    a use determination unit configured to generate the preliminary use information signal in response to a write enable signal and a plurality of word line enable signals; and
    a use information generation unit configured to generate use information signals according to the plurality of word line enable signals and the preliminary use information signal.

12. The semiconductor memory apparatus according to claim 8, wherein the use information storage block is configured to perform the read operation according to the read command, regardless of a result of determining whether the data write operation has already been performed for the plurality of cell arrays, in response to a test mode signal.

13. The semiconductor memory apparatus according to claim 8, further comprising:
    a plurality of sense amplifiers configured to perform a sensing operation, the sense amplifiers not performing a sensing operation for data outputted through a plurality of local input/output lines from the plurality of cell arrays, according to a use information signals with respect to the cell arrays, regardless of a read enable signal; and
    a column address decoder configured to electrically couple, among the plurality of local input/output lines, a local input/output line corresponding to a column address signal to the plurality of sense amplifiers.

14. A semiconductor memory apparatus comprising:
a plurality of cell arrays; and
a use information storage block configured to determine whether a data has not been written to the plurality of cell arrays, and generate a preliminary user information signal and plurality of control signals,
wherein the use information storage block is configured to block a refresh operation and a read operation for a cell array in which the data has not been written, among the plurality of cell arrays, according to the preliminary user information signal regardless of an activation of a read command and an activation of a refresh command, and
wherein the use information storage block is configured to allow the refresh operation and the read operation for the cell array in which the data has been written.

15. The semiconductor memory apparatus according to claim 14, further comprising:
a plurality of word line drivers configured to generate a plurality of word line driving signals in response to the plurality of control signals, the plurality of word line driving signals being used for driving word line arrays electrically coupled to the plurality of cell arrays; and
a plurality of sense amplifiers configured to perform a sensing operation, the sense amplifiers not performing a sensing operation for data outputted from the cell arrays, according to use information signals with respect to the cell arrays, regardless of a read enable signal.

16. The semiconductor memory apparatus according to claim 15, wherein the plurality of word line drivers are configured to generate the plurality of word line driving signals in response to the plurality of control signals and a plurality of word line enable signals.

17. The semiconductor memory apparatus according to claim 14, wherein the use information storage block is configured to generate use information signals according to a write enable signal and a plurality of word line enable signals.

18. The semiconductor memory apparatus according to claim 14, wherein the use information storage block comprises:

a use determination unit configured to generate the preliminary use information signal in response to a write enable signal and a plurality of word line enable signals;
a control signal generation unit configured to generate a plurality of control signals according to preliminary use information signals and a refresh signal; and
a use information generation unit configured to generate use information signals according to the plurality of word line enable signals and the preliminary use information signal.

19. The semiconductor memory apparatus according to claim 14, wherein the use information storage block is configured to perform the refresh operation according to the refresh command and perform the read operation according to the read command, regardless of a result of determining whether the data write operation has already been performed for the plurality of cell arrays, in response to a test mode signal.

20. The semiconductor memory apparatus according to claim 14, further comprising:
a plurality of word line arrays electrically coupled to the plurality of cell arrays;
a row address decoder configured to generate a plurality of word line enable signals in response to a row address signal and an active/refresh control signal;
a plurality of word line drivers configured to generate a plurality of word line driving signals for driving the plurality of word line arrays, in response to the plurality of control signals;
a plurality of sense amplifiers configured to not perform a sensing operation for data outputted through a plurality of local input/output lines from the plurality of cell arrays, according to use information signals, regardless of a read enable signal; and
a column address decoder configured to electrically couple a local input/output line corresponding to a column address signal among the plurality of local input/output lines, with the plurality of sense amplifiers.

* * * * *